(12) United States Patent
Bhat et al.

(10) Patent No.: US 12,119,930 B2
(45) Date of Patent: Oct. 15, 2024

(54) BIT INTERLEAVED CODED MODULATION-ITERATIVE DECODER FOR HIGH-SPEED RECEIVER

(71) Applicant: HUGHES NETWORK SYSTEMS, LLC, Germantown, MD (US)

(72) Inventors: Srilekha Bhat, Boyds, MD (US); Yanlai Liu, Rockville, MD (US); Bala Subramaniam, Potomac, MD (US); Liping Chen, Bethesda, MD (US); Mustafa Eroz, Rockville, MD (US)

(73) Assignee: HUGHES NETWORK SYSTEMS, LLC, Germantown, MD (US)

( * ) Notice: Subject to any disclaimer, the term of this patent is extended or adjusted under 35 U.S.C. 154(b) by 32 days.

(21) Appl. No.: 17/977,760

(22) Filed: Oct. 31, 2022

(65) Prior Publication Data

US 2024/0146451 A1    May 2, 2024

(51) Int. Cl.
*H04L 1/00*      (2006.01)
*H04L 25/03*     (2006.01)

(52) U.S. Cl.
CPC ........ *H04L 1/005* (2013.01); *H04L 25/03318* (2013.01)

(58) Field of Classification Search
CPC .......................... H04L 1/005; H04L 25/03318
USPC .......................... 375/315–316, 324, 340–341
See application file for complete search history.

(56) References Cited

U.S. PATENT DOCUMENTS

| | | |
|---|---|---|
| 8,347,195 B1 | 1/2013 | Varnica et al. |
| 8,880,973 B1 * | 11/2014 | Li ...................... H03M 13/4138 |
| | | 714/752 |
| 2009/0225878 A1 * | 9/2009 | Papadopoulos ... H03M 13/6331 |
| | | 375/260 |
| 2011/0051860 A1 * | 3/2011 | Tang ...................... H04L 25/023 |
| | | 375/341 |
| 2011/0276861 A1 * | 11/2011 | Chun .................... H04L 1/0047 |
| | | 714/752 |

(Continued)

FOREIGN PATENT DOCUMENTS

| | | |
|---|---|---|
| EP | 2690790 A1 | 1/2014 |
| EP | 2879295 A1 | 6/2015 |

OTHER PUBLICATIONS

International Search Report and Written Opinion mailed Dec. 18, 2023 for International Application No. PCT/US2023/035309.

*Primary Examiner* — Emmanuel Bayard
(74) *Attorney, Agent, or Firm* — Sheppard, Mullin, Richter & Hampton LLP (57) ABSTRACT

The disclosure relates to bit-interleaved coded modulation with iterative decoding. In some implementations, a receiver comprises: a first memory including multiple first sub-memories; a decoder configured to perform first operations comprising: calculating, first extrinsic information of multiple code bits associated with multiple received symbols; and a demapper configured to perform second operations comprising: calculating soft decision information of the code bits; calculating, based on the soft decision information and the first extrinsic information, second extrinsic information of the code bits; and writing the second extrinsic information of the code bits into the first memory such that, for each received symbol, each sub-memory of the first sub-memories respectively stores the second extrinsic information associated with a respective one of the code bits corresponding to the received symbol.

18 Claims, 9 Drawing Sheets

(56) References Cited

U.S. PATENT DOCUMENTS

| | | | |
|---|---|---|---|
| 2012/0057641 A1* | 3/2012 | Sadough | H04L 1/0066 |
| | | | 375/242 |
| 2013/0283120 A1* | 10/2013 | Wu | H03M 13/3972 |
| | | | 714/755 |
| 2015/0200747 A1* | 7/2015 | Petrov | H03M 13/19 |
| | | | 714/776 |

* cited by examiner

| | | Demod Symbol RAM 90x360x16-bit, R(360*k+24*n+m), n=[0,14], m=[0,23], k=[0,360/samp-per-symbol] | | | | | |
|---|---|---|---|---|---|---|---|
| | | | | | | 8PSK | |
| | | | | | 8PSK | | |
| | | | | 16APSK | | | |
| | | | 32APSK | | | | |
| | | 64APSK | | | | | |
| k | n14 | n13 | ... | n1 | ... | n0 | |
| 0 | R359 | R335 | R336 | ... | R47 | R24 | R23 | R0 |
| 1 | R719 | R695 | R696 | | R407 | R384 | R383 | R360 |
| 2 | | | | | | | | |
| ... | | | | | | | | |
| 29 | R10799 | | R10776 | | | | R10463 | R10440 |
| 35 | R12959 | | R12936 | | | | R12623 | R12600 |
| 44 | R16199 | | R16176 | | | | R15863 | R15840 |
| 59 | R21599 | | R21576 | | | | R21263 | R21240 |
| 89 | R32399 | | R32376 | | | | R32063 | R32040 |

FIG. 8

BIT INTERLEAVED CODED MODULATION-ITERATIVE DECODER FOR HIGH-SPEED RECEIVER

BACKGROUND

Bit-interleaved coded modulation (BICM) refers to a modulation and coding scheme that separates the output out of a channel encoder and the input of a modulator with a bit-level interleaver. Due to the small penalty in channel capacity compared to the coded modulation capacity for fading channels and additive white Gaussian noise (AWGN) channels, BICM can be particularly suitable for use over fading channels and AWGN channels. When BICM with iterative decoding (BICM-ID) is used, a demapper and decoder can iteratively exchange information to improve system performance.

SUMMARY

The disclosure relates to improved systems and methods for iteratively exchanging information between a demapper and decoder in a receiver implementing BICM-ID.

In one embodiment, a receiver, comprises: a first memory including multiple first sub-memories; a decoder configured to perform first operations comprising: calculating, first extrinsic information of multiple code bits associated with multiple received symbols; and a demapper configured to perform second operations comprising: calculating soft decision information of the code bits; calculating, based on the soft decision information and the first extrinsic information, second extrinsic information of the code bits; and writing the second extrinsic information of the code bits into the first memory such that, for each received symbol, each sub-memory of the first sub-memories respectively stores the second extrinsic information associated with a respective one of the code bits corresponding to the received symbol.

In some implementations, the receiver further comprises a second memory including multiple second sub-memories, wherein: the first extrinsic information of the code bits is written in the second memory such that, for each received symbol, each sub-memory of the second sub-memories respectively stores the first extrinsic information of a respective one of the code bits corresponding to the received symbol; and the second operations further comprise: reading, from the second memory, the first extrinsic information.

In some implementations, reading the first extrinsic information from the second memory, comprises: reading, in an interleaved order, the first extrinsic information from the second memory; and writing the second extrinsic information into the first memory comprises: writing, in a deinterleaved order, the second extrinsic information into the first memory.

In some implementations, calculating the soft decision information of the code bits, comprises: calculating, based on the first extrinsic information, an estimate of symbol probabilities for each of the received symbols; calculating, based on constellation points associated with a modulation scheme of the received symbols, Euclidean distances (ED) for each of the received symbols; combining the estimates of the symbol probabilities with the ED to form a combination; and calculating the soft decision information based on the combination.

In some implementations, multiple iterations of the second operations are performed; and the ED for each of the received symbols are calculated during each of the multiple iterations.

In some implementations, the receiver further comprises a second memory to store the received symbols, wherein during each of the iterations that the ED are calculated, the received symbols are read from the second memory.

In some implementations, the soft decision information comprises a first set of least log-likelihood ratios (LLRs) of the code bits; the first extrinsic information comprises a second set of LLRs of the code bits; and calculating, based on the soft decision information and the first extrinsic information, the second extrinsic information, comprises: subtracting the second set of LLRs from the first set of LLRs.

In some implementations, multiple instances of the second operations are performed in parallel, each of the instances being performed for a respective one or more of the received symbols.

In some implementations, a number of bits per symbol of a modulation scheme associated with the received symbols is the same as the number of first sub-memories.

In some implementations, the first operations further comprise: reading the second extrinsic information of the code bits from the first sub-memories; and adding, during a current decoding iteration, the first extrinsic information with the second intrinsic information to form an input for a subsequent decoding iteration.

In some implementations, the receiver further comprises a second memory including multiple second sub-memories; and the first operations further comprise: writing in the second memory, in an interleaved order, the first extrinsic information such that, for each received symbol, each sub-memory of the second sub-memories respectively stores the first extrinsic information of a respective one of the code bits corresponding to the received symbol.

In some implementations, the first operations further comprise: calculating, during a first decoder iteration, a priori soft decision information of the code bits; and calculating, during a second decoder iteration after the first decoder iteration, a posteriori soft decision information of the code bits; and calculating the first extrinsic information comprises subtracting the a priori soft decision information from the a posteriori soft decision information.

In some implementations, the receiver further comprises a demodulator configured to demodulate a radio frequency (RF) signal to generate a digital signal including a sampled sequence of the received symbols.

In some implementations, the receiver is a receiver of a satellite terminal; and the receiver further comprises: an antenna for receiving the RF signal on a downlink, and circuitry for downconverting the RF signal prior to the demodulator demodulating the RF signal.

In one embodiment, a receiver comprises: one or more processors; and one or more non-transitory computer-readable storage mediums storing instructions that, when executed by the one or more processors, cause the receiver to perform operations comprising: obtaining a sampled sequence of multiple received symbols associated with multiple code bits; calculating, at a decoder, first extrinsic information of the code bits; calculating, at a demapper, soft decision information of the code bits; calculating, at the demapper, based on the soft decision information and the first extrinsic information, second extrinsic information of the code bits; and writing, at the demapper, the second extrinsic information of the code bits into a first memory including multiple first sub-memories such that, for each received symbol, each sub-memory of the first sub-memories respectively stores the second extrinsic information associated with a respective one of the code bits corresponding to the received symbol.

In some implementations, the first extrinsic information of the code bits is written in a second memory including multiple second sub-memories such that, for each received symbol, each sub-memory of the second sub-memories respectively stores the first extrinsic information of a respective one of the code bits corresponding to the received symbol; and the second operations further comprise: reading, at the demapper, from the second memory, the first extrinsic information.

In some implementations, reading the first extrinsic information from the second memory, comprises: reading, in an interleaved order, the first extrinsic information from the second memory; and writing the second extrinsic information into the first memory comprises: writing, in a deinterleaved order, the second extrinsic information into the first memory.

In some implementations, a number of bits per symbol of a modulation scheme associated with the received symbols is the same as the number of first sub-memories and the number of second sub-memories.

In some implementations, the operations further comprise: reading, at the decoder, the second extrinsic information of the code bits from the first sub-memories; and adding, during a current decoding iteration, the first extrinsic information with the second intrinsic information to form an input for a subsequent decoding iteration.

In one embodiment, a method comprises: obtaining, at a receiver, a sampled sequence of multiple received symbols associated with multiple code bits; calculating, at a decoder of the receiver, first extrinsic information of the code bits; calculating, at a demapper of the receiver, soft decision information of the code bits; calculating, at the demapper, based on the soft decision information and the first extrinsic information, second extrinsic information of the code bits; and writing, at the demapper, the second extrinsic information of the code bits into a first memory including multiple first sub-memories such that, for each received symbol, each sub-memory of the first sub-memories respectively stores the second extrinsic information associated with a respective one of the code bits corresponding to the received symbol.

Other features and aspects of the disclosure will become apparent from the following detailed description, taken in conjunction with the accompanying drawings, which illustrate, by way of example, the features in accordance with various embodiments. The summary is not intended to limit the scope of the invention, which is defined solely by the claims attached hereto.

BRIEF DESCRIPTION OF THE DRAWINGS

The technology disclosed herein, in accordance with one or more embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION

The performance of BICM can be greatly improved through BICM-ID by iteratively exchanging information between a demapper (referred to herein as running an "outer iteration") and a decoder (referred to herein as running an "inner iteration") at the receiver in an AWGN channel. However, the implementation of interleaving, deinterleaving, the calculation of the extrinsic information of the inner iteration, the calculation of the extrinsic information of the outer iteration, switching, and/or merging can necessitate complex hardware requirements, especially for higher modulation types such as 64APSK. Although less hardware can be used to achieve a balanced implementation, this can increase processing time, resulting in fewer iterations being processed over a given time and worse system performance. Additionally, due to memory access limitations in some current implementations of a receiver, the scheduling and/or information exchange between the inner and outer iterations can add complexity that results in a time penalty.

Implementations of the disclosure are directed to improved systems and methods for iteratively exchanging information between a demapper and decoder in a receiver implementing BICM-ID.

In accordance with some implementations of the disclosure, split channel RAMs can be employed for read and write operations such that the processing time for each outer iteration of a demapper can be significantly reduced for different modulation types (e.g., up to 64APSK) without any time penalty. In some implementations, a first split-channel RAM can employ "on the fly" deinterleaving when writing extrinsic information of the demapper into memory, and a second split-channel RAM can employ on the fly interleaving when reading extrinsic information from the decoder stored in memory. Each channel RAM can be split such that memory access is increased by the modulation factor (i.e., transmission rate bits per symbol) of the transmitted data. For example, memory access can be increased six times for 64APSK.

Additional implementations of the disclosure are directed to reducing the processing time for each outer iteration of the demapper by parallelizing multiple instances of soft decision calculations made for one or more received symbols at the demapper such that multiple soft decisions can be calculated for multiple respective symbols per clock cycle. Such parallelization can be leveraged for multiple different modulation types.

Further implementations of the disclosure are directed to additional techniques for improved BICM-ID, including on the fly: extracting and storing the initial soft information of the decoder during a first inner iteration; calculating the extrinsic information of the decoder during a second inner iteration of the decoder; and/or merging the extrinsic information of the deinterleaved bits from the outer iteration with the latest a posteriori from the inner iteration.

By virtue of implementing the BICM-ID techniques described herein to improve BICM performance, the capacity of a link to a receiver (e.g., forward link from satellite gateway earth station to satellite terminal) can be improved, allowed signal reception at a lower Signal to Interference & Noise Ratio (SINR) ratio, thereby lowering the power requirements at the receiver to receive the same amount of data. In a satellite communications system, this can translate to a significant improvement of capacity per satellite, enabling a given satellite to serve more subscribers.

Figure 1:
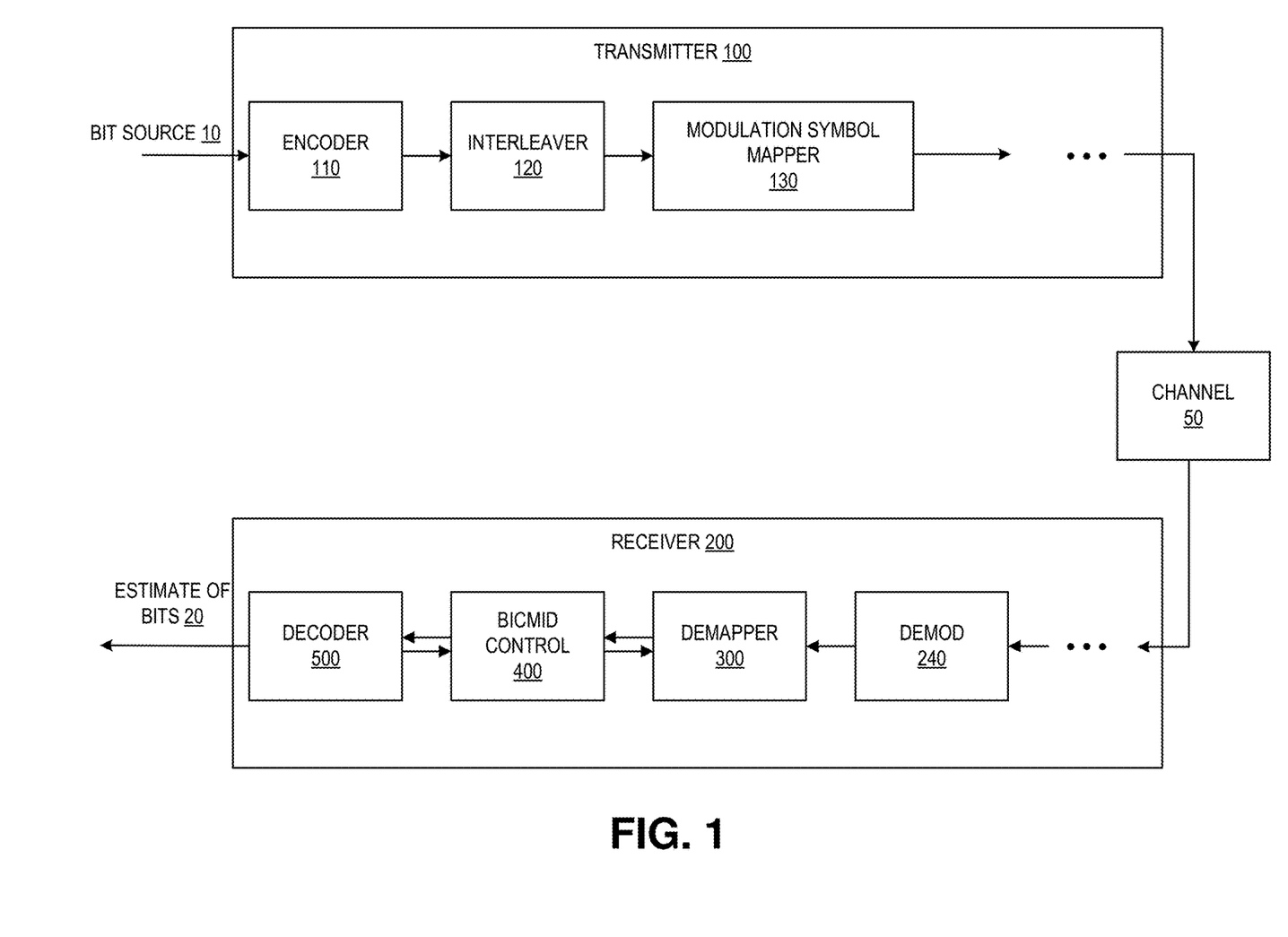
FIG. 1 illustrates an example communications system including a receiver in which the BICM-ID systems and methods described herein can be implemented.

FIG. 1 illustrates an example communications system in which the BICM-ID systems and methods described herein can be implemented. It should be noted that although embodiments will be primarily be described in the context of satellite communication systems, it is contemplated that the technology described herein can be implemented in other communication systems, including cellular communication systems (e.g., 5G communication systems).

As shown in the communication system of FIG. 1, a transmitter 100 transmits a data signal over a communication channel 50 to a receiver 200. The data signal may carry image, video, audio, and/or other information. Although a single channel of communication is shown in this example, it should be appreciated that the technology described herein may be implemented in multi-channel communication systems. Additionally, although some example components of a transmitter 100 and receiver 200 are illustrated in this example, it should be appreciated that other transmitter and/or receiver configurations can be implemented, the order of components can be varied, some components may be excluded, added, or combined, and that one or more of these components can be implemented in either digital form (e.g., as software running on a DSP or other processing device, with the addition of a DAC) or as analog components.

Transmitter 100 includes encoder 110, interleaver 120, and symbol modulator/mapper 103. In satellite communication system implementations, transmitter 100 may be a transmitter of a user terminal, such as, for example, a very small aperture terminal (VSAT) that transmits on an inroute of the satellite communication system. Alternatively, transmitter 100 may be a transmitter of a satellite gateway that transmits on an outroute.

Bit source 10 provides information bits to be transmitted to encoder 110. The information may include, for example, images, video, audio, text and other data. Although bit source 10 is illustrated in this example as being separate from transmitter 100, in some implementations bit source 10 may be incorporated into transmitter 100. The information bits provided to encoder 110 can be encapsulated to form baseband data frames or data blocks.

Encoder 110 performs forward error correction (FEC) by adding redundancy to information data bits of the input signal. FEC can improve the capacity of a channel by adding redundant information to the data being transmitted through the channel, the redundant information being used to correct for errors introduced by the transmission of the signal over the transmission channel or link during signal reception. Examples of forward error correction codes that can be applied by encoder 110 can include block codes (e.g., low-density parity check codes (LDPC), turbo codes, Reed-Solomon codes, Hamming codes, Hadamard codes, BCH codes, and so on), and convolutional codes. In one particular implementation, encoder 110 can include a Bose-Chaudhuri-Hocquenghem codes (BCH) encoder followed by a LDPC encoder. The BCH encoder can process baseband data frames by adding additional redundant information based on one or more of the BCH encoding algorithms used in conjunction with the signal transmission protocol, and the LDPC encoder can further processes the BCH encoded data frames to add a second layer of redundant information, or error correction information, to the data frames for error correction using one or more LDPC algorithms.

Interleaver 120 rearranges the encoded data bits to make distortion at receiver 200 more independent from bit to bit and provide additional error correction capability during reception. For example, sections (e.g., bits) of data frames including one or more layers of error correction can be rearranged with respect to location or position (i.e., in time) within the data frames.

The modulation symbol mapper 130 maps the interleaved bits (e.g., within the frames) to complex-valued modulation symbols representing positions (i.e., in amplitude, phase, and/or time) in a modulated signal waveform based on a symbol constellation map for a modulation scheme. The bits can be modulated using any of a number of different modulation techniques. Examples of modulation schemes that can be implemented include amplitude and phase shift keying (APSK), e.g., 16-APSK, 32-APSK, 64-APSK, 128-APSK, or 256-APSK, quadrature phase shift keying (QPSK), 8PSK, M-ary phase shift keying (MPSK), quadrature amplitude modulation (QAM), and so forth.

A transmit pulse-shaping filter of transmitter 100 (not shown) can convert the complex-valued data symbols to a transmit waveform signal using a pulse shaping function with an impulse response. Following filtering of the transmit signals at a filter, a mixer of transmitter 100 (not shown) can mix the waveform signal of the filter output with a carrier signal from a local oscillator (not shown) to modulate it onto an appropriate carrier for transmission using appropriate transmitter hardware (e.g., an outdoor unit including a satellite dish antenna).

The output signal from transmitter 100 is transmitted over channel 50 to receiver 200. In satellite communication system implementations, the output signal from transmitter 100 is transmitted on an uplink to a satellite transponder. For example, the satellite transponder can process the signal through an input multiplexing (IMUX) filter to select the desired carrier, amplify it (e.g., using a traveling-wave tube amplifier), and output it using an output multiplexing (OMUX) filter for reception by a receiver 200 on a downlink.

The receiver 200 receives an input signal over channel 50 (e.g., on a carrier from a satellite transponder) and outputs an estimate of the carrier's bits 20. During transmission over the channel 50, the transmitted signal will encounter various physical effects that manifest as noise experienced in the received signal. The added channel noise typically may be idealized as AWGN. Additionally, other sources of noise can be introduced into the signal. As such, the signal demodulated at the receiver 200 can include a noise corrupted signal including noise corrupted data associated with data (e.g., data block/frame) encoded as described above.

In this example, receiver 120 includes a demodulator 240, a demapper 300, a BICM-ID control 400, and a decoder 500 (e.g., an LDPC decoder). In some implementations, receiver 200 can be a receiver of a satellite gateway that receives signals on an inroute. In other implementations, receiver can be a receiver of a user terminal (e.g., VSAT) that receives signals on an outroute. In some implementations, one or more of the components of receiver 200 can be implemented in an application-specific integrated circuit (ASIC). As discussed above, in some implementations other configurations of receiver 200 can be implemented, and one or more components of receiver 200 can be implemented in either digital form (e.g., as software running on a DSP or other processing device, with the addition of a DAC) or as analog components.

A mixer of the receiver (not shown) can mix an input waveform signal (e.g., as received from a satellite transponder) with a carrier down conversion signal from a local oscillator (not shown) to downconvert the received signal to baseband. The receiver 200 can also include a receive filter (not shown) that is configured to apply a receive filtering function to the downconverted carrier signal. The receiver filter can be matched to a transmit filter of the transmitter 100.

Demodulator 240 is configured to demodulate the downconverted carrier signal to generate a digital signal including a sampled sequence of demodulated/received symbols. To overcome the channel impairment and optimize performance, appropriate synchronization techniques can be employed such as carrier frequency synchronization, carrier phase synchronization, and symbol time synchronization. Carrier amplitude gain control can also be applied to compensate the fading attenuation on the received signals.

The operations of demapper 300, BICM-ID control 400, and decoder 500, which perform BICM-ID by iteratively exchanging extrinsic information between demapper 300 and decoder 500 to estimate the bits associated with the received digital signal, are further described below.

Figure 2:
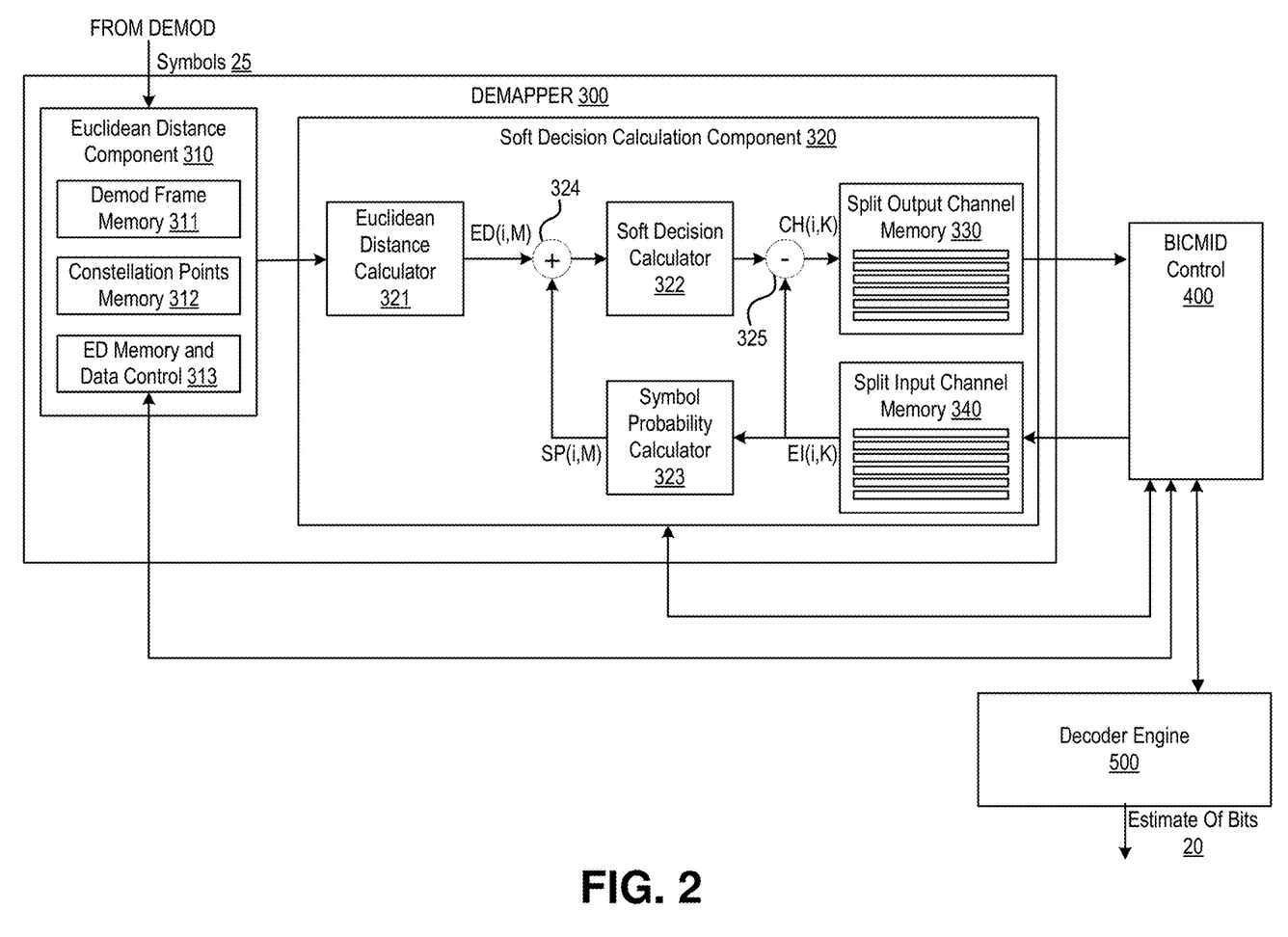
FIG. 2 is a block diagram illustrating example components of a receiver, including components of a demapper, that performs BICM-ID in accordance with some implementations of the disclosure.
Figure 3:
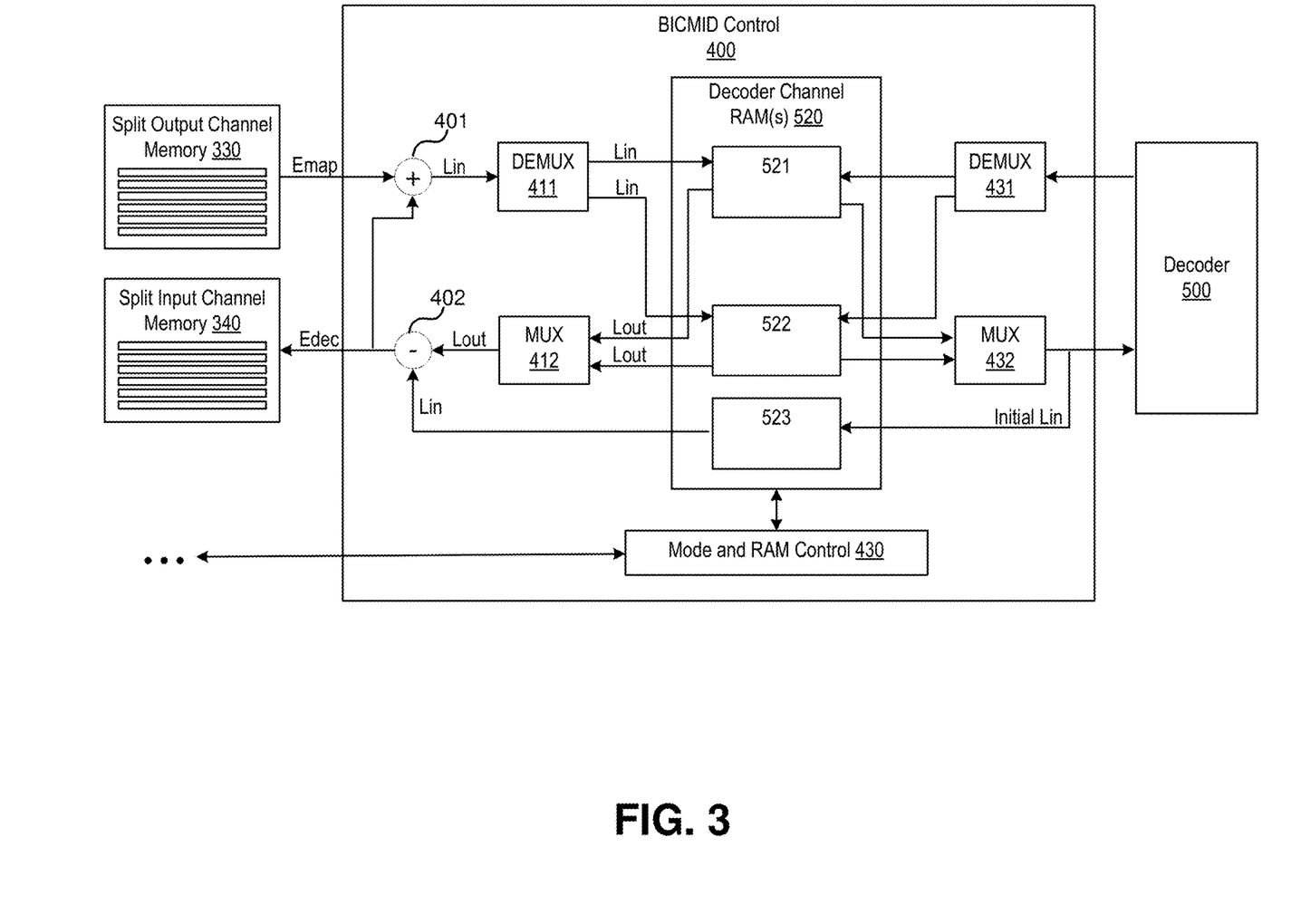
FIG. 3 is a block diagram illustrating example components of a receiver, including components of a BICM-ID control and decoder, that performs BICM-ID in accordance with some implementations of the disclosure.

FIGS. 2-3 are block diagrams illustrating example components of a demapper 300, BICM-ID control 400, and decoder 500 of a receiver 200 that performs BICM-ID in accordance with some implementations of the disclosure. FIG. 2 illustrates some components of demapper 300, and FIG. 3 illustrates some components of BICM-ID control 400 and decoder 500. For ease of illustration, in FIG. 2 BICM-ID control 400 is depicted as being a separate component from demapper 300 and decoder 500. However, as depicted in FIG. 3, it should be appreciated that one or more components of BICM-ID control 400 can be incorporated in decoder 500 (i.e., decoder channel RAM(s) 520) and/or demapper 300.

During operation, symbols 25 are received at demapper 300, and an estimate of bits 20 is output by decoder 500. As depicted in this example and other examples that follow, M refers to a number of constellation points of the modulation scheme, K refers to a number of transmission bits per symbol of the modulation scheme, and i refers to a number of symbols.

Demapper 300 includes a ED component 310 and a soft decision calculation component 320. The ED component 310 includes one or more demodulation frame memories 311, a constellation points memory 312, and a ED memory and data control 313. The illustrated memories can be implemented as RAMs. The symbols 25 received from demodulator 240 can be stored in the one or more demodulation frame memories 311 to enable real-time calculation of EDs during every outer iteration of demapper 300.

Figure 8:
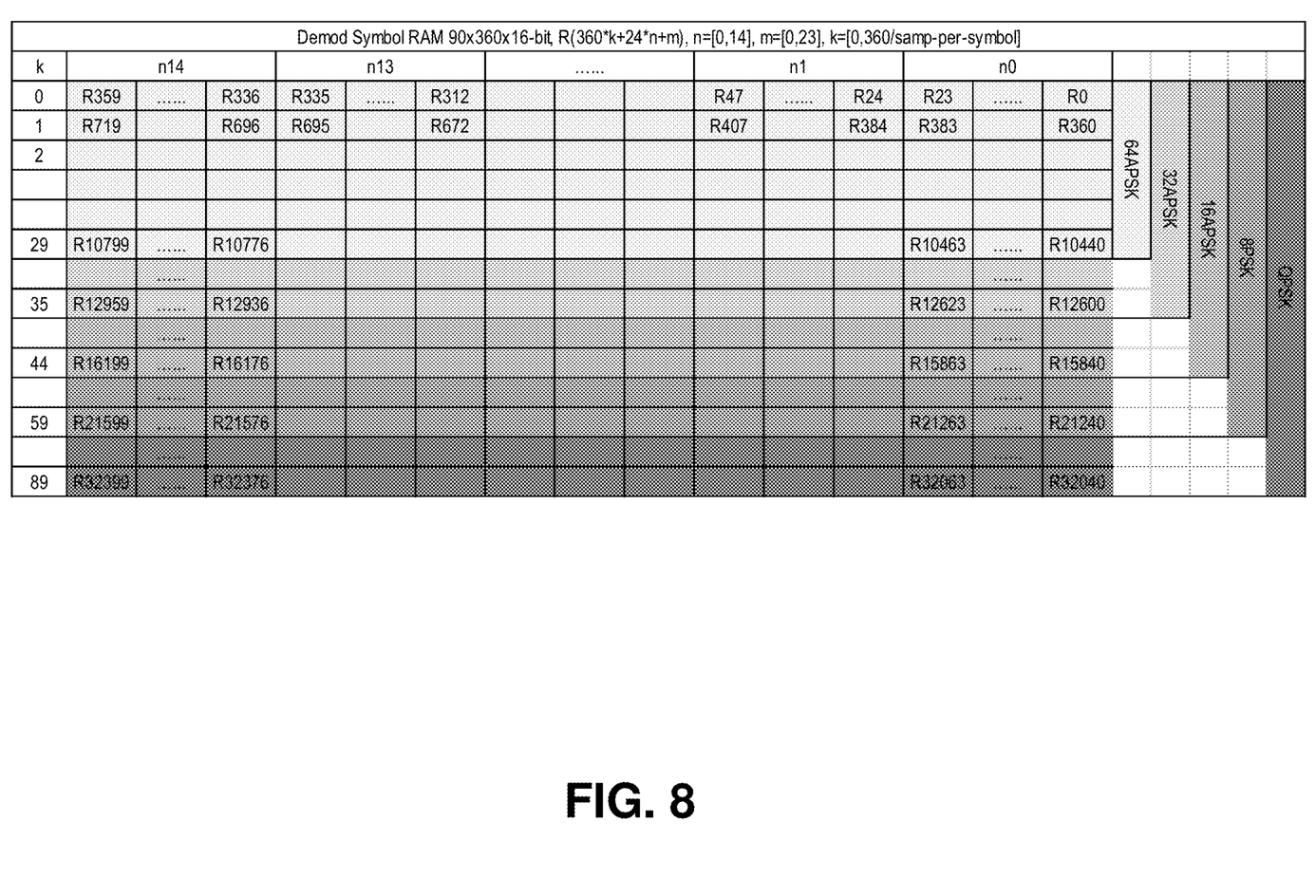
FIG. 8 depicts a frame RAM configured to store symbols received from a demodulator, for BICM-ID, in accordance with some implementations of the disclosure.

For example, FIG. 8 depicts a frame RAM configured to store real/received symbols in instances where data is transmitted in accordance with the Digital Video Broadcasting-Satellite-Second Generation (DVB-S2) standard that uses FEC frames having a size of 64,800 bits. As depicted by the example of FIG. 8, the one or more frame memories 311 can be configured to have sufficient space to store symbols of all modulation types (e.g., 64APSK, 32APSK, 16APSK, 8PSK, and QPSK). For instance, a 64-APSK frame can have 64,800/6=10,800 symbols stored in the one or more frame memories 311 for each frame. In this example, each row of 360 symbols is split into 15 groups of 24 symbols. To finish processing one row of 360 symbols, 24 parallel processing engines (e.g., 24 instances of soft decision calculation component 320) can process 15 groups of 24 symbols. By virtue of this implementation, EDs calculated by soft decision calculation component 320 do not need to be stored, which could require significantly more memory usage. In alternative implementations, the calculated EDs can be stored in memory.

A constellation points memory 312 (e.g., RAM) can hardcode or otherwise store the ideal positions of the points representing the symbols for the different modulation types the receiver 200 is capable of processing. For example, constellation points can be hardcoded for the 64APSK, 32APSK, 16APSK, 8PSK, and QPSK modulation types. The ED memory and data control 313 can control the operation of memory 312 and one or more demodulation frame memories 311 depending on the modulation type of the processed data.

Soft decision calculation component 320 can include a ED calculator 321, a soft decision calculator 322, a symbol probability calculator 323, a split output channel memory 330, and a split input channel memory 340. The ED calculator 321 is configured to calculate, for each received symbol (e.g., as retrieved from memory 311), based on the constellation points (e.g., as retrieved from memory 312) for the symbol modulation scheme, Euclidean distances ED(i, M). Euclidean distances between the received symbol and each of the M points of the constellation can be calculated.

Symbol probability calculator 323 is configured to calculate, for each received symbol, estimates of symbol probabilities SP(i, M). The symbol probabilities can be calculated using extrinsic information EI (i,K) from the decoder 500 that was stored in split input channel RAM 340, the extrinsic information from the decoder 500 including soft decision information calculated at the decoder. In implementations, an interleaver is embedded in an access control of split input channel memory 340.

The estimates of symbol probabilities SP(i, M) can be combined with the Euclidean distances ED (i, M) using adder 324, and input to soft decision calculator 322. Soft decision calculator 322 is configured to calculate, for each symbol, based on the combination of the symbol probabilities SP (i, M) and Euclidean distance ED (i, M), soft decision information SD(i, K) for each symbol. Soft decisions can be calculated for the K bits associated with the symbol. Each soft decision can represent the probability that a received data bit associated with the symbol is a 0 or 1. Each soft decision can be represented as a LLR.

Using a subtractor 325, the channel error/updated soft decisions CH(i, K) for each bit of each symbol can be determined by taking the difference between the output of soft decision calculator 322 (SD(i, k)) and extrinsic information EI(i, k). Like the output of soft decision calculator 322, the extrinsic information EI(i, k) and channel errors CH(i, k) can be represented as LLRs. The updated soft decisions, which represent the extrinsic information of the demapper 300 that is passed to the decoder 500, are written to split output channel memory 330. In implementations, a deinterleaver is embedded in an access control of split output channel memory 330.

As depicted in this example, split output channel memory 330 is split into multiple physical sub-memories (e.g., six sub-RAMs). When the multiple soft decisions CH(i,K) associated with a given symbol are written into memory 330, each soft decision is written into a respective sub-memory. In addition, during this memory writing operation, deinterleaving of the symbols can be performed. In some implementation, the total number of sub-memories is equal to the highest number of transmission rate bits per symbol of the modulation schemes utilized by the receiver 200. In some implementations, a top-level RAM wrapper can be utilized by output channel memory 330 to provide transparent and absolute addresses such that all sub-RAMs are suitable for deinterleaving on the fly for all modulation types utilized at the receiver 200. As output channel memory 330 can operate to deinterleave the extrinsic information from the demapper 300, input data to output channel memory 330 can be written in a column-wise format to memory and output data from output channel memory 330 can be read in a row-wise format. For example, 360 extrinsic soft decisions per row of a RAM 330 can be read out row-by-row and sent to one of the decoder channel RAMs 520.

As also depicted in this example, split input channel memory 340 is split into multiple physical sub-memories (e.g., six sub-RAMs). When the extrinsic information/soft decisions EI (i,K) from the decoder 500 associated with the bits of a symbol are read from memory 340, each soft decision/extrinsic information associated with each bit is read from a respective sub-memory. In addition, during this memory reading operation, interleaving of the symbols can be performed. As in the example of output channel memory 330, the total number of sub-memories can be equal to the highest number of transmission rate bits per symbol of the modulation schemes utilized by the receiver 200. A top-level RAM wrapper can similarly be utilized by input channel memory 340 to provide transparent and absolute addresses such that all sub-RAMS are suitable for interleaving on the fly for all modulation types utilized at the receiver 200. As split input channel memory 340 can operate to interleave the extrinsic information from the decoder 500, input data to input channel memory 340 can be written in a row-wise format to memory and output data from input channel memory 340 can be read in a column-wise format. For example, during input data interleaving, at the writing side, a 360×6-bit input data can be written into memory 340 row by row starting from the first row of the first sub-memory. When reading, multiple groups of EI(i,K) associated with given symbols can be read out from memory 340, each group of EI being read out from a respective sub-memory. For example, six extrinsic soft decisions associated with the bits of a symbol can be read from respective sub-memories.

Figure 7A:
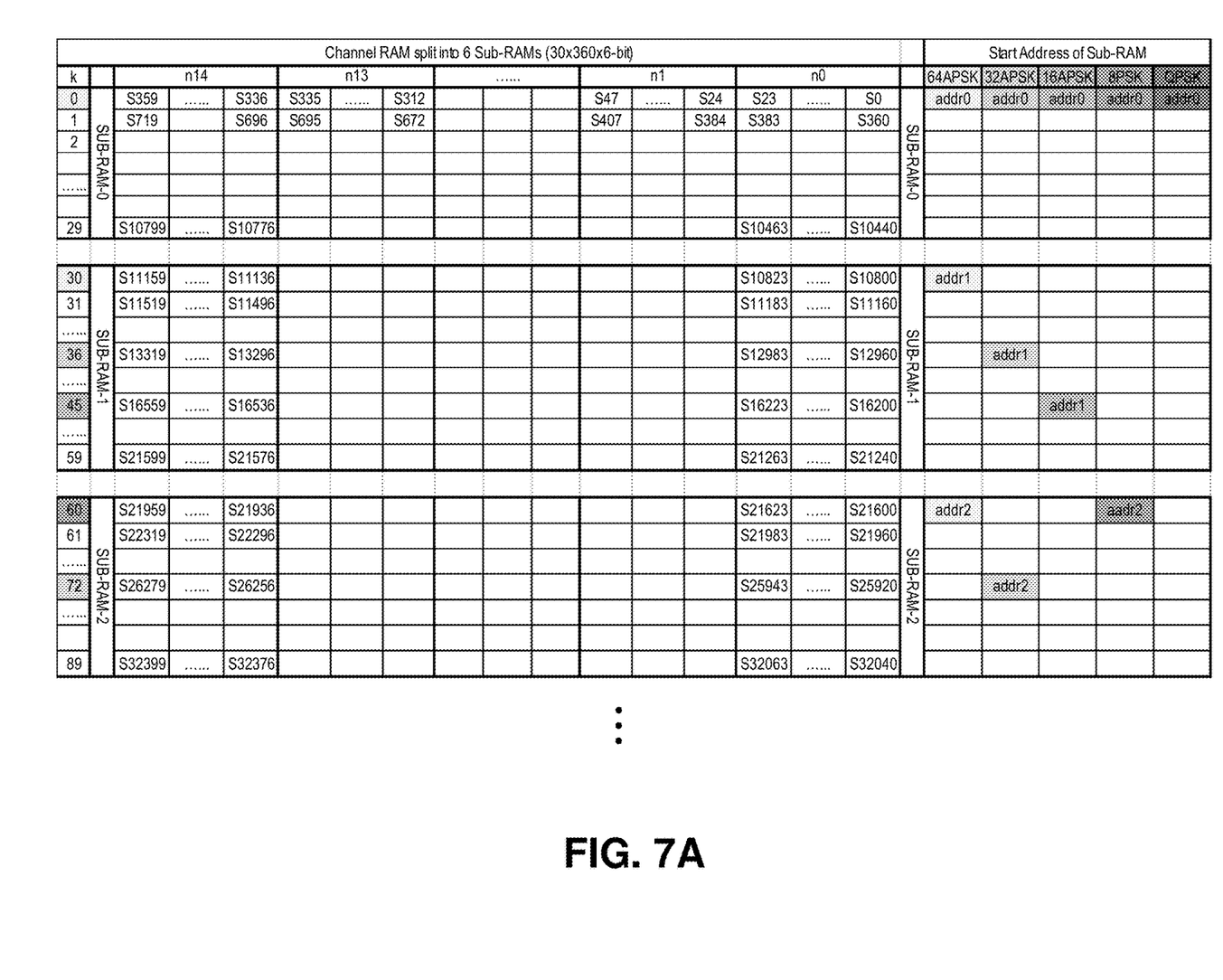
FIG. 7A depicts an example channel RAM split into six sub-RAMS that may be utilized by a demapper, in accordance with some implementations of the disclosure where DVBS2 frames are utilized by the communication system.
Figure 7B:
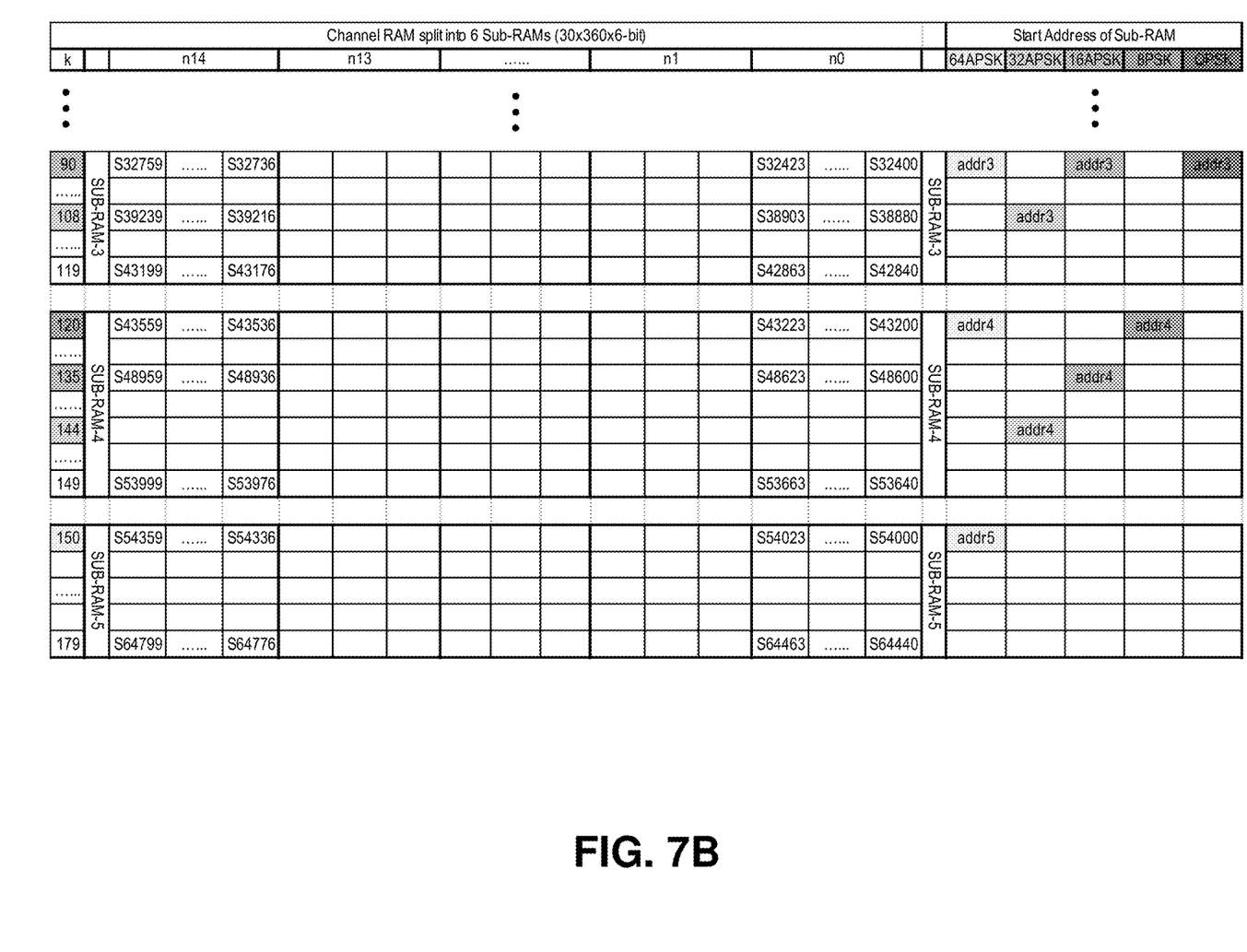
FIG. 7B depicts an example channel RAM split into six sub-RAMs that may be utilized by a demapper, in accordance with some implementations of the disclosure where DVBS2 frames are utilized by the communication system.

FIGS. 7A-7B depict an example channel RAM split into six sub-RAMS that may be utilized by a demapper 300 in accordance with some implementations of the disclosure where DVBS2 frames are utilized by the communication system. As depicted in this example, the split channel RAM is configured to store soft decisions/extrinsic information associated with five different modulation schemes: 64APSK, 32APSK, 16APSK, 8PSK, and QPSK. The rightmost column, coded for different modulation schemes, shows where addressing can begin in the RAM. The channel RAM is split into six sub-RAMS to accommodate the six soft decisions required for the six bits per symbol of 64APSK. As such, the six soft decisions associated with a 64APSK symbol can be accessed simultaneously, during a single clock cycle. Rather than sequentially accessing one SD at a time for the 64APSK symbol, all six SD can be simultaneously accessed, improving processing time by six times in this example. During writing of symbols from 64-APSK frames, each of the six soft decisions for 64-APSK symbols can be written 64800/6=10,800 address locations apart. For 32-APSK frames, where there are 64800/5=12,960 symbols in each frame, five sub-RAMs can be virtually assigned without address access conflicts, and five sub-RAMs can be accessed during each clock cycle. Similarly, for 16-APSK frames, 4 sub-RAMS can be accessed during each clock cycle, and so forth.

By virtue of splitting memory 330 and memory 340 into multiple sub-memories, thereby parallelizing soft decision/extrinsic information writes/reads to/from memory, processing time at an outer iteration of the demapper 300 can be greatly improved, thereby enabling a more efficient operation of BICM-ID.

Referring now to FIG. 3, which illustrates one particular example of a BICM-ID control 400, BICM-ID control 400 includes a mode and RAM control 430 configured to control memory access of one or more decoder channel RAMs 520, split output channel memory 330, and/or split input channel memory 340. The control 400 can also coordinate timing among the demapper 300, the deinterleaver, interleaver, and decoder 500 for different modulation types.

The extrinsic information output from the decoder 500 (Edec) can be calculated by subtracting, using subtractor 402, the input of the decoder iteration (Lin) from the output of the decoder iteration (Lout).

Deinterleaved extrinsic information (Emap) from demapper 300 is read from split output channel memory 330. The deinterleaved extrinsic information obtained from the demapper 300 is added with the extrinsic information output from the decoder 500 to generate the input Lin for the next decoder iteration. adder 401 is used to add Emap and Edec.

The one or more decoder channel RAMs can include first and second, equally sized (e.g., 180×3600 bits), channel RAMs 521, 522 that function as alternating buffers. When a current frame stored in one of the two RAMs/buffers 521, 522 is being decoded, another frame can be stored at the same time in the other RAM/buffer. The demultiplexer 411 can be used to store an input frame in the RAM/buffer that is free.

The decoder channel RAM(s) 520 can also include a third Channel RAM 523 (e.g., 180×3600 bits in size) to store the input during the first decoder iteration, Initial Lin, when data is read out from the first or second RAMs/buffers 521, 522. The third channel RAM 523 can be used to generate Edec by providing the Lin subtracted from Lout by subtractor 402.

During the decoder iterations, the multiplexer/demultiplexer 431, 432 can be used to multiplex the read data and write data from/to the decoder channel RAMs/buffers 521, 522.

Figure 4:
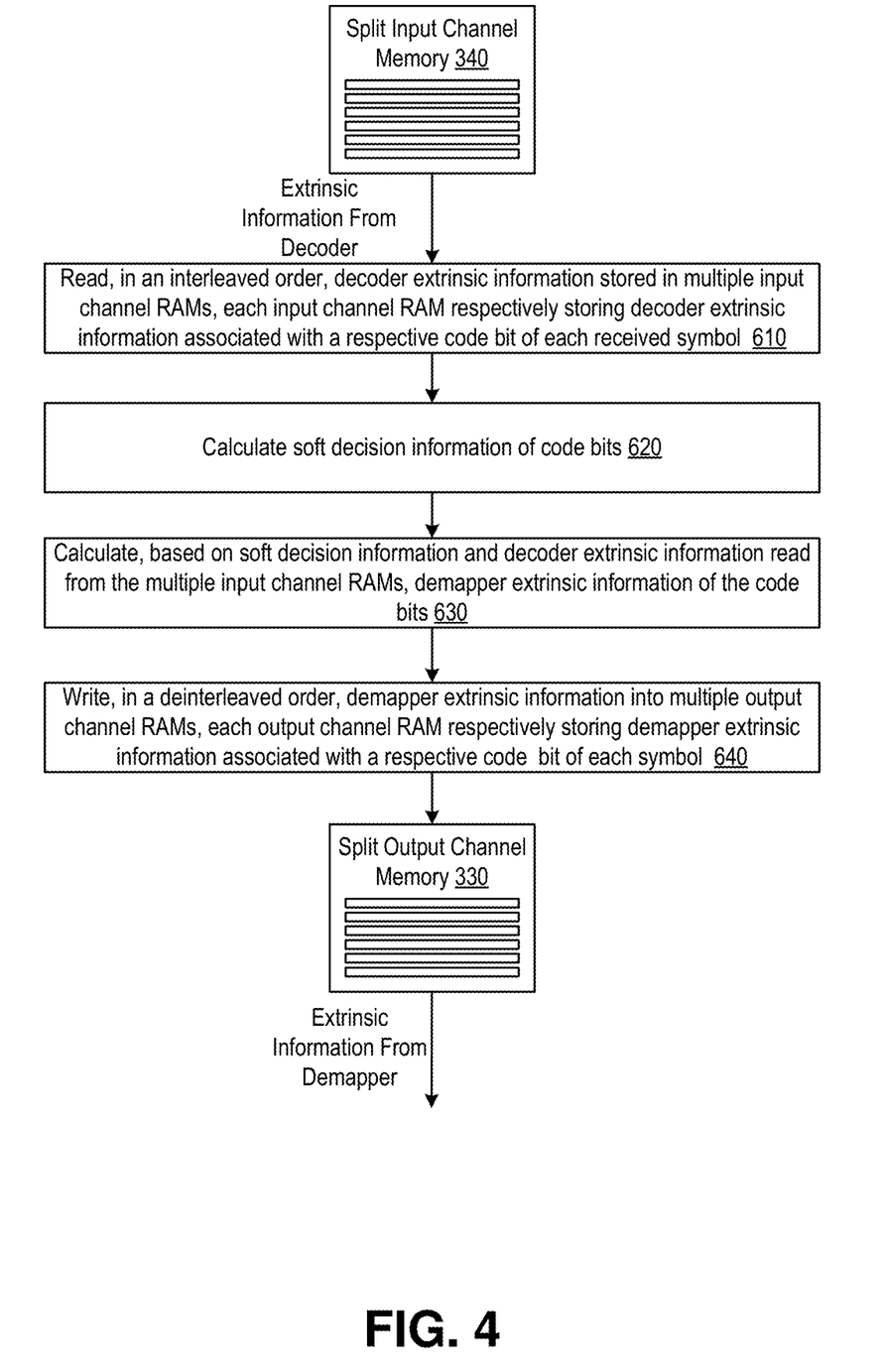
FIG. 4 is an operational flow diagram illustrating some example operations that can be performed by a demapper during BICM-ID, in accordance with some implementations of the disclosure.

FIG. 4 is an operational flow diagram illustrating some example operations that can be performed by a demapper 300 during BICM-ID to estimate code bits given received symbols of an input data frame, in accordance with some implementations of the disclosure. Operation 610 includes reading, in an interleaved order, decoder extrinsic information stored in multiple input channel RAMs, each input channel RAM respectively storing decoder extrinsic information associated with a respective code bit of each received symbol. For example, after a decoder writes 360 extrinsic soft decisions to the input channel RAM row by row, the extrinsic soft decisions can be interleaved in such a manner that each input channel RAM respectively stores decoder extrinsic information associated with a respective code bit of each received symbol. Operation 620 includes calculating soft decision information of the code bits. In some implementations, the soft decision information can be calculated for the code bits of each received symbol based on a Euclidean distance calculation and symbol probability calculation as described above. The symbol probability calculation can be made based on the decoder extrinsic information. During the start of decoding, the symbol probabilities can be initialized to 0. Operation 630 includes calculating, based on the soft decision information and the decoder extrinsic information read from the multiple input channel RAMs, demapper extrinsic information of the code bits. As discussed above, the demapper extrinsic information can be determined based on the difference between the output of soft decision calculator 322 and the input of the outer iteration EI(i,K), indicated as CH(i,K) in FIG. 2. Operation 640 includes writing, in a deinterleaved order, the demapper extrinsic information into multiple output channel RAMs, each output channel RAM respectively storing demapper extrinsic information associated with a respective code bit of each received symbol.

Figure 5:
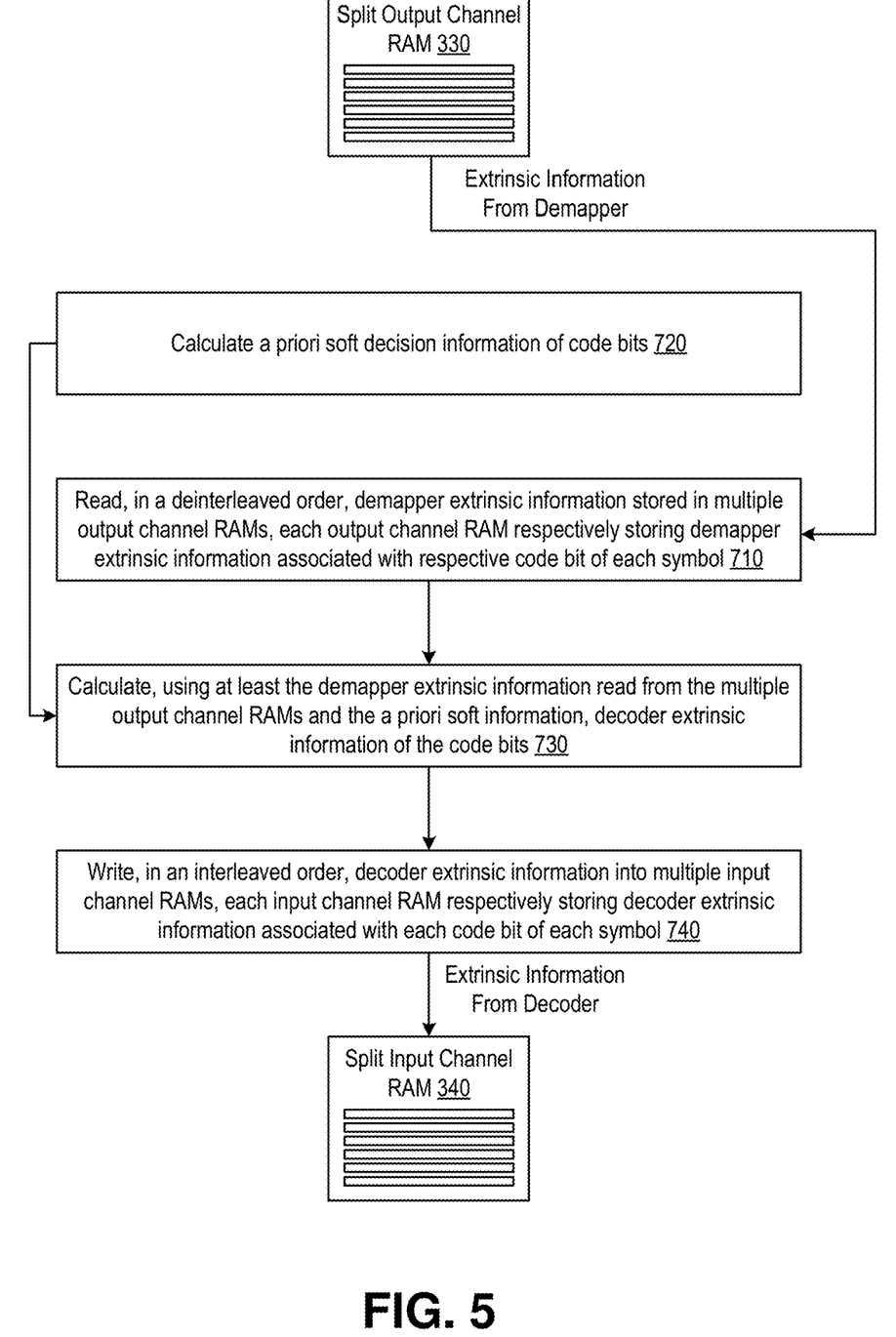
FIG. 5 is an operational flow diagram illustrating some example operations that can be performed by a BICM-ID control and/or decoder during BICM-ID, in accordance with some implementations of the disclosure.

FIG. 5 is an operational flow diagram illustrating some example operations that can be performed by a BICM-ID control 400 and/or decoder 500 during BICM-ID, in accordance with some implementations of the disclosure. Operation 710 includes calculating a priori soft decision information of the code bits. Operation 720 includes reading, in a deinterleaved order, demapper extrinsic information stored in multiple output RAMS, each output channel RAM respectively storing demapper extrinsic information associated with a respective code bit of each symbol received at the receiver. Operation 730 includes calculating, using at least the demapper extrinsic information read from the multiple output channel RAMs and the a priori soft information, decoder extrinsic information of the code bits. Operation 740 includes writing, in an interleaved order, decoder extrinsic information into multiple input channel RAMs, each input channel RAM respectively storing decoder extrinsic information associated with each code bit of each received symbol.

Figure 6:
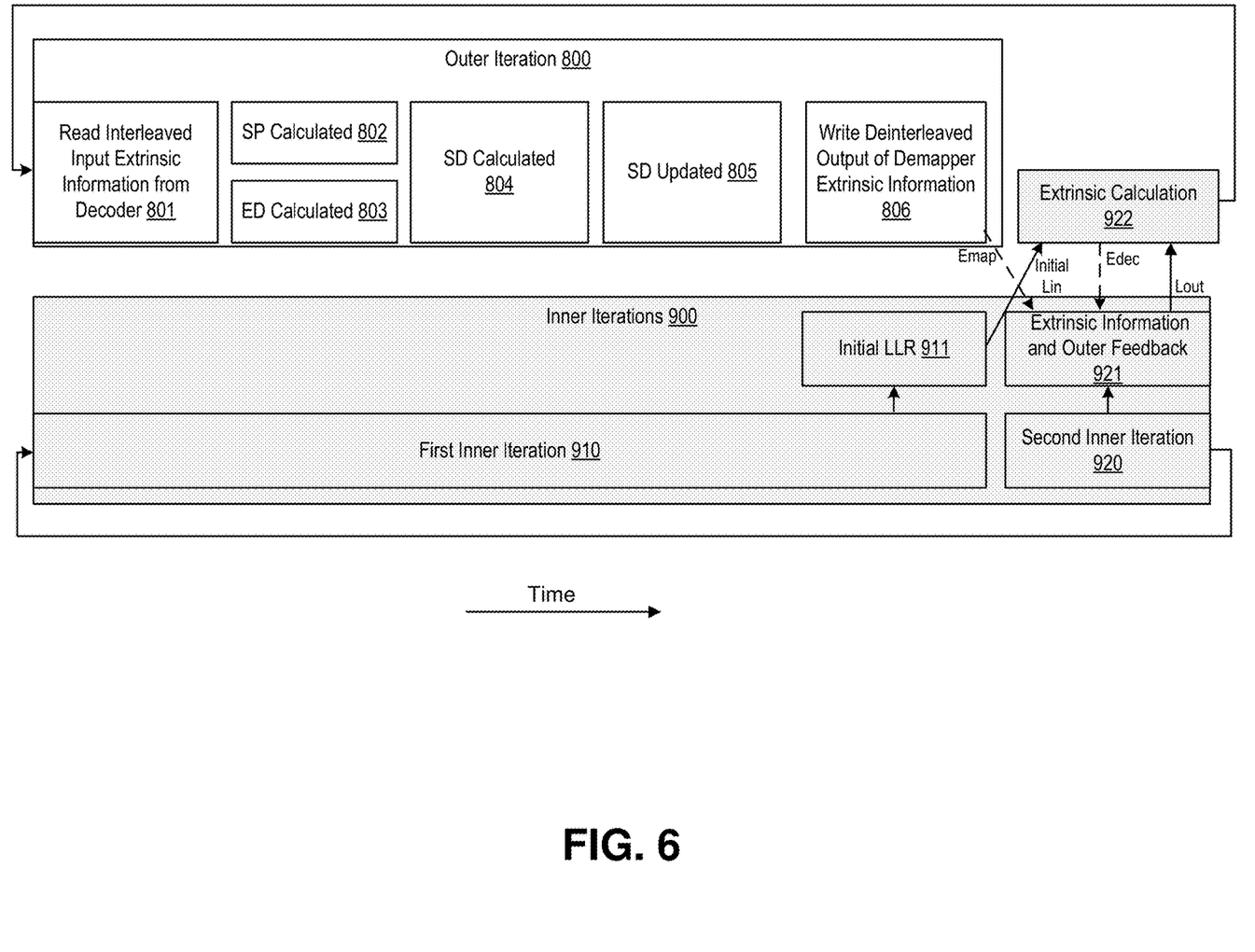
FIG. 6 shows a timing diagram depicting the iterative operation of a demapper and decoder during BICM-ID, in accordance with some implementations of the disclosure.

FIG. 6 shows a timing diagram depicting the iterative operation of demapper 300 and decoder 500 during BICM-ID, in accordance with some implementations of the disclosure. As depicted, top, recursive outer iteration 800 corresponds to processing performed using demapper 300, and bottom, recursive inner iterations 900 correspond to processing performed using decoder 500. In this implementation, the timing loop is designed such that one outer iteration 800 can be performed for every two inner iterations 900. In other words, two inner iterations of time pass before the next cycle of iterative demapping and decoding. In this example, the outer iteration 800 generates the demapper extrinsic information by completion of the first inner iteration 910. The second inner iteration 920 is conducting the decoder's extrinsic generation and merging. The extrinsic information exchange happens at the time of the second inner iteration 920.

Referring to outer iteration 800, operation 801 includes reading (e.g., from multiple input RAMs associated with a memory 340), the interleaved input extrinsic information from the decoder. Operation 802 includes calculating the SP (e.g., SP(i, M)) associated with each received/demodulated symbol. Operation 803 includes calculating the ED (e.g., ED(i, M)) associated with each received/demodulated symbol. The ED can be scaled by a SNR. Operation 804 includes generating, using the SP and ED, soft decisions SD (e.g., SD(i, k)) of the coded bits for each of the received/demodulated symbols using the SP. During the start of the decoding process (i.e., first loop) the SP can all be set to 0, and thereafter calculated using the extrinsic information feedback from the inner iteration/decoder. Operation 805 includes updating, based on the interleaved input extrinsic information from the decoder, the SD (e.g., LLRs), to obtain updated SD (e.g., updated LLRs). The updated SD, which correspond to the demapper extrinsic information are, at operation 806, written (e.g., into multiple output RAMs associated with a memory 330) as deinterleaved output extrinsic information from the demapper. The demapper extrinsic information can be deinterleaved depending on the number of constellation points corresponding to the modulation type currently being used. The deinterleaved output is provided by the decoder.

Referring to inner iterations 900 (shaded in gray), during a first inner iteration 910, a priori soft decision information, depicted as initial LLR 911, is calculated for the coded bits. During the second inner iteration 920, which includes operations 921 and 922, the decoder generates the decoder extrinsic information of the coded bits, and this extrinsic information is provided to the input channel RAM (used at operation 801) of the outer iteration 800. On-fly interleaving can be automatically conducted during the writing and reading of the input channel RAM, such that the interleaved extrinsic information matches the order of demodulated/received symbols and can be directly used to generated updated symbol probabilities. Also during the second inner iteration 920, when the deinterleaved outer extrinsic information is available, the decoder adds the calculated decoder extrinsic information Edec to the demapper extrinsic information Emap (e.g., as shown by adder 401 in FIG. 3) and this result (e.g., Lin) can be stored in a decoder channel RAM for a next cycle of iterative decoding (operation 920). As such, the deinterleaved extrinsic information fed back from the outer iteration 800 can be merged onto the latest a posteriori soft decision information from the second inner iteration 920 so that the time of such merging is hidden. Additionally, during operation 922 the initial Lin (initial LLR) is subtracted from the decoder output Lout to generate the decoder extrinsic information.

As the foregoing examples illustrate, interleaving and deinterleaving before the extrinsic information exchange can be time consuming especially for higher modulation type since it can take multiple number of clock cycles to read or write the soft decisions of each symbol. By virtue of using split channel RAMs as discussed above, the processing at the outer iteration 800 can be significantly improved such that one outer iteration 800 can be completed for every two inner iterations 900.

In some implementations, symbol processing at demapper 300 by soft decision calculation component 320 can be parallelized to further improve the processing speed of the outer iteration. As such, multiple instances of soft decision calculation component 320 can be run in parallel, thereby parallelizing multiple instances of soft decision calculations made for each received symbol at the demapper such that multiple soft decisions can be calculated for multiple respective symbols per clock cycle. In one particular implementation, parallel processing at a speed of 24 symbols per clock cycle can be enabled (e.g., for modulation types of 64APSK and 32APSK). In some implementations, the hardware for parallel processing of symbols higher modulation types (e.g., 64APSK or 32APSK) can be used to enable parallel processing of even more symbols per clock cycle for lower modulation types (e.g., 16 APSK or lower). For example, for 16APSK symbol modulation, two sets of 24-symbols per clock cycle could potentially be simultaneously processed.

To enable parallel processing as described above, the one or more demodulation frame memories 311 can be structured such that the multiple symbols being processed in parallel can be read out. For example, FIG. 8 depicts an example of a demodulation symbol RAM that enables parallel processing of 24 symbols per clock cycle. At every clock, 24 symbols can be read out from the RAM 311, and processed parallelly by 24 soft decision calculation components 320.

By virtue of implementing the foregoing features, the decoder can be kept running during BICM-ID, not idling or waiting for extrinsic information to be fed back from the outer iteration 800. When an outer iteration 800 completes, it can seed the updated bitwise soft decisions to the decoder. Similarly, the operation of the demapper can be optimized such that each instance of reading from the interleaved split memory to writing to the deinterleaved split memory, functions are preformed every clock cycle.

In this document, the terms "machine readable medium," "computer readable medium," and similar terms are used to generally refer to non-transitory mediums, volatile or non-volatile, that store data and/or instructions that cause a machine to operate in a specific fashion. Common forms of machine readable media include, for example, a hard disk, solid state drive, magnetic tape, or any other magnetic data storage medium, an optical disc or any other optical data storage medium, any physical medium with patterns of holes, a RAM, a PROM, EPROM, a FLASH-EPROM, NVRAM, any other memory chip or cartridge, and networked versions of the same.

These and other various forms of computer readable media may be involved in carrying one or more sequences of one or more instructions to a processing device for execution. Such instructions embodied on the medium, are generally referred to as "instructions" or "code." Instructions may be grouped in the form of computer programs or other groupings. When executed, such instructions may enable a processing device to perform features or functions of the present application as discussed herein.

In this document, a "processing device" may be implemented as a single processor that performs processing operations or a combination of specialized and/or general-purpose processors that perform processing operations. A processing device may include a CPU, GPU, APU, DSP, FPGA, ASIC, SOC, and/or other processing circuitry.

The various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

Each of the processes, methods, and algorithms described in the preceding sections may be embodied in, and fully or partially automated by, code components executed by one or more computer systems or computer processors comprising computer hardware. The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. Additionally, unless the context dictates otherwise, the methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A receiver, comprising:
a first memory including multiple first sub-memories;
a second memory including multiple second sub-memories;
a decoder configured to perform first operations comprising: calculating, first extrinsic information of multiple code bits associated with multiple received symbols, wherein the first extrinsic information of the code bits is written in the second memory such that, for each received symbol, each sub-memory of the second sub-memories respectively stores the first extrinsic information of a respective one of the code bits corresponding to the received symbol; and
a demapper configured to perform second operations comprising:
calculating soft decision information of the code bits;
calculating, based on the soft decision information and the first extrinsic information, second extrinsic information of the code bits;
writing the second extrinsic information of the code bits into the first memory such that, for each received symbol, each sub-memory of the first sub-memories respectively stores the second extrinsic information associated with a respective one of the code bits corresponding to the received symbol; and
reading, from the second memory, the first extrinsic information.

2. The receiver of claim 1, wherein:
reading the first extrinsic information from the second memory, comprises: reading, in an interleaved order, the first extrinsic information from the second memory; and
writing the second extrinsic information into the first memory comprises: writing, in a deinterleaved order, the second extrinsic information into the first memory.

3. The receiver of claim 1, wherein calculating the soft decision information of the code bits, comprises:
calculating, based on the first extrinsic information, an estimate of symbol probabilities for each of the received symbols;
calculating, based on constellation points associated with a modulation scheme of the received symbols, Euclidean distances (ED) for each of the received symbols;
combining the estimates of the symbol probabilities with the ED to form a combination; and
calculating the soft decision information based on the combination.

4. The receiver of claim 3, wherein:
multiple iterations of the second operations are performed; and
the ED for each of the received symbols are calculated during each of the multiple iterations.

5. The receiver of claim 4, further comprising a third memory to store the received symbols, wherein during each of the iterations that the ED are calculated, the received symbols are read from the third memory.

6. The receiver of claim 3, wherein:
the soft decision information comprises a first set of least log-likelihood ratios (LLRs) of the code bits;
the first extrinsic information comprises a second set of LLRs of the code bits; and
calculating, based on the soft decision information and the first extrinsic information, the second extrinsic information, comprises: subtracting the second set of LLRs from the first set of LLRs.

7. The receiver of claim 1, wherein multiple instances of the second operations are performed in parallel, each of the instances being performed for a respective one or more of the received symbols.

8. The receiver of claim 1, wherein a number of bits per symbol of a modulation scheme associated with the received symbols is the same as a number of the first sub-memories.

9. The receiver of claim 1, wherein the first operations further comprise:
reading the second extrinsic information of the code bits from the first sub-memories; and
adding, during a current decoding iteration, the first extrinsic information with the second extrinsic information to form an input for a subsequent decoding iteration.

10. The receiver of claim 1, wherein:
the first operations further comprise: writing in the second memory, in an interleaved order, the first extrinsic information such that, for each received symbol, each sub-memory of the second sub-memories respectively stores the first extrinsic information of a respective one of the code bits corresponding to the received symbol.

11. The receiver of claim 1, wherein:
the first operations further comprise:
calculating, during a first decoder iteration, a priori soft decision information of the code bits; and
calculating, during a second decoder iteration after the first decoder iteration, a posteriori soft decision information of the code bits; and
calculating the first extrinsic information comprises subtracting the a priori soft decision information from the a posteriori soft decision information.

12. The receiver of claim 1, further comprising a demodulator configured to demodulate a radio frequency (RF) signal to generate a digital signal including a sampled sequence of the received symbols.

13. The receiver of claim 12, wherein:
the receiver is a receiver of a satellite terminal; and
the receiver further comprises:
an antenna for receiving the RF signal on a downlink, and
circuitry for downconverting the RF signal prior to the demodulator demodulating the RF signal.

14. A receiver, comprising:
one or more processors; and
one or more non-transitory computer-readable storage mediums storing instructions that, when executed by the one or more processors, cause the receiver to perform operations comprising:
obtaining a sampled sequence of multiple received symbols associated with multiple code bits;
calculating, at a decoder, first extrinsic information of the code bits;
calculating, at a demapper, soft decision information of the code bits;
calculating, at the demapper, based on the soft decision information and the first extrinsic information, second extrinsic information of the code bits;
writing, at the demapper, the second extrinsic information of the code bits into a first memory including multiple first sub-memories such that, for each received symbol, each sub-memory of the first sub-memories respectively stores the second extrinsic information associated with a respective one of the code bits corresponding to the received symbol; and
reading, at the demapper, from a second memory including multiple second sub-memories, the first extrinsic information,
wherein the first extrinsic information of the code bits is written in the second memory such that, for each received symbol, each sub-memory of the second sub-memories respectively stores the first extrinsic information of a respective one of the code bits corresponding to the received symbol.

15. The receiver of claim 14, wherein:
reading the first extrinsic information from the second memory, comprises: reading, in an interleaved order, the first extrinsic information from the second memory; and
writing the second extrinsic information into the first memory comprises: writing, in a deinterleaved order, the second extrinsic information into the first memory.

16. The receiver of claim 15, wherein a number of bits per symbol of a modulation scheme associated with the received symbols is the same as a number of the first sub-memories and a number of the second sub-memories.

17. The receiver of claim 14, wherein the operations further comprise:
reading, at the decoder, the second extrinsic information of the code bits from the first sub-memories; and
adding, during a current decoding iteration, the first extrinsic information with the second extrinsic information to form an input for a subsequent decoding iteration.

18. A method, comprising:
obtaining, at a receiver, a sampled sequence of multiple received symbols associated with multiple code bits;
calculating, at a decoder of the receiver, first extrinsic information of the code bits;
calculating, at a demapper of the receiver, soft decision information of the code bits;
calculating, at the demapper, based on the soft decision information and the first extrinsic information, second extrinsic information of the code bits; and
writing, at the demapper, the second extrinsic information of the code bits into a first memory including multiple first sub-memories such that, for each received symbol, each sub-memory of the first sub-memories respectively stores the second extrinsic information associated with a respective one of the code bits corresponding to the received symbol; and
reading, at the demapper, from a second memory including multiple second sub-memories, the first extrinsic information,
wherein the first extrinsic information of the code bits is written in the second memory such that, for each received symbol, each sub-memory of the second sub-memories respectively stores the first extrinsic information of a respective one of the code bits corresponding to the received symbol.

* * * * *